United States Patent [19]

Sliwa, Jr.

[11] Patent Number: 4,535,219
[45] Date of Patent: Aug. 13, 1985

[54] INTERFACIAL BLISTER BONDING FOR MICROINTERCONNECTIONS

[75] Inventor: John W. Sliwa, Jr., Cupertino, Calif.

[73] Assignee: Xerox Corporation, Stamford, Conn.

[21] Appl. No.: 433,577

[22] Filed: Oct. 12, 1982

[51] Int. Cl.³ .............................................. B23K 27/00
[52] U.S. Cl. ................................ 219/121 LC; 29/840; 219/121 LD; 219/121 ED; 361/400; 361/403; 361/421
[58] Field of Search ..... 219/121 L, 121 LM, 121 LC, 219/121 LD, 121 EC, 121 ED, 121 PJ, 121 PK; 228/179; 29/830, 840; 361/400, 403, 421, 398

[56] References Cited

U.S. PATENT DOCUMENTS

| | | | |
|---|---|---|---|
| 3,614,541 | 10/1971 | Farrand | 29/840 X |
| 3,626,350 | 12/1971 | Suzuki | 338/69 |
| 3,895,288 | 7/1975 | Lampen et al. | 338/69 |
| 3,911,234 | 10/1975 | Kotaka | 361/398 X |
| 4,180,711 | 12/1979 | Hirata et al. | 361/398 X |
| 4,276,538 | 6/1981 | Eventoff et al. | 338/69 |
| 4,404,453 | 9/1983 | Gotman | 219/121 LD |

FOREIGN PATENT DOCUMENTS 2008588 3/1972 Fed. Rep. of Germany ...... 228/179

Primary Examiner—C. L. Albritton
Attorney, Agent, or Firm—Serge Abend

[57] ABSTRACT

A method for producing microinterconnections including the steps of providing a first support member bearing electrical circuit elements including first electrical contacts and first electrical traces, providing a second support member bearing electrical circuit elements including second electrical contacts and second electrical traces, placing the second support member in face-to-face spaced and aligned relationship with respect to the first support member, and applying energy to the first support member for moving portions thereof underlying ones of the first contacts toward and into intimacy with aligned ones of the second contacts.

20 Claims, 27 Drawing Figures

INTERFACIAL BLISTER BONDING FOR MICROINTERCONNECTIONS

This invention relates to a novel interconnection method enabling the selective singular or gang-formation of metallurgically bonded contacts, joining closely juxtaposed circuit features, in a face-to-face mating relationship, such as, those on IC chips with those on a hybrid substrate. The method involves depositing energy on contact-bearing areas of a novel substrate to thereby cause a blistering layer, disposed on the substrate beneath a contact, to transport or urge the contact into intimacy with a closely juxtaposed mating contact for metallurgical bonding.

A means for selectively, singularly or gang connecting matching contacts across a controlled interfacial gap is provided, wherein the gap maintains those matching contacts, not to be connected, in the open-circuit mode and permits some interfacial shear strain between the interconnected elements to be tolerated. The nature of the blistering process provides a degree of insensitivity to the size of the interfacial gap.

The most widely used present interconnection technologies for joining chips to packages or substrates are wirebonding and tape-automated-bonding (TAB). The state of the art in wirebonding involves 25 micron diameter wires requiring 100 micron square bond sites on 150 micron centers. It is a sequential process with rates of approximately seven bonds per second. Wire bonding is only suitable for perimeter bonding.

Tape-automated-bonding involves gang-bonding an array of interconnections disposed on a film carrier to the perimeter bonding pads of an IC chip. Since TAB is a gang-bonding approach, it is not easily amenable to any type of sequential or selective connection. TAB is finding use where a few hundred (at most) regularly arranged contacts are bonded time and time again on the same type of chip. The bonding density can be improved over wirebonding, due to the ability to bond 50 micron contacts on approximately 125 micron centers. Although this approach is amenable to area-wise simultaneous interconnection, wherein the IC chip may be covered with contacts, this extension of the technology is still in the developmental stage.

A third class of interconnection technology for joining an IC chip to a substrate involves a face-down (flip-chip) area-wise approach wherein miniature reflowed solder bumps bridge a small but closely controlled gap between substrate contacts and adjacent chip contacts. IBM has perfected this technology which it refers to as controlled-collapse-chip-connection ($C^4$). It is by far the densest interconnection technology commercially in use today. However, it is strictly a non-selective bonding process, greatly susceptible to interfacial shear strain failure if strict limits are not observed. Within certain constraints, involving chip size and thermal cycling, the approach works well.

In application, each of these known bonding techniques either applies a substantial force to the device bonding pad during bonding or creates a situation for high stresses after bonding. Since the bonding processes can thus give rise to stress gradients around the bonds, some residual subsurface silicon damage may permanently exist or, in the case of $C^4$, be generated later due to the thermal expansion mismatch between the bonded chip and substrate. In order to minimize the potential deleterious effects of such bonding, the bonding pads are usually isolated from sensitive regions of the device.

What is required for continuing reliability and performance improvements in systems is a gentler interconnection technology such as that described herein that will also permit chips to be packed much more closely together, each chip having perhaps thousands of interconnection sites. Not only would interchip signal degradation and propagation delay problems be overcome, problems which now limit performance in multichip systems, but successive interconnections could be made in a sequence dependent on which portions of each chip were operable. The electrical testing of a multichip system during its interconnection process makes economic sense but is currently impractical. It would become practical employing this invention. Finally, the ability to connect chips to mating components at a density level much closer to that of the chip circuitry itself would literally open up a new degree of freedom for systems designers. In conjunction with the higher density would come a lower defect introduction rate, critical to the success of VLSI.

In an effort to avoid the performance, cost and reliability penalties one must pay if current widely used chip interconnection technologies are implemented in assembling many smaller chips, there is a trend toward the fabrication of larger and larger chips. Although laser and electrical fuseblowing techniques can be employed to replace the increasing quantities of defective devices found on such large-area devices with redundant circuits, the complexity, and sophistication of the equipment, processes and personnel necessary to implement VLSI on very large chips drives the cost to unacceptable levels.

By employing the present invention it will be possible for virtually any chip maker or user to quilt together closely abutted small chips to form a "wafer-scale" system. Small chips yield well and when combined with the excellent yield of the ultra-high density interconnection process set forth herein will put wafer-scale systems within reach of most chip makers. Thus, a quilt or matrix-equivalent of a wafer scale system will be substantially less costly and far easier to construct.

In the case of a quilted array of small chips one may, for the first time, combine different IC technologies on the same "wafer". For example, GaAs chips, NMOS chips and ECL chips could be quilted together by practising this invention, thus permitting an optimal mix of technologies with a chip-to-chip interconnection density nearly the same as that found on true single-wafer systems. The inherent programmability of this novel interconnection process also permits customized test-determined interconnection sequencing for optimal yield and minimal rework.

Since the interconnections formed in accordance with this invention may range in size from 1 micron to 1000 microns and have any shape desired, i.e., round, square, linear, etc. and may be formed on nonplanar surfaces in a non-contact manner, possibly from the outside of an hermetically sealed volume, the applications to microelectronics are pervasive and exciting.

In addition to "quilting" chips into wafer-scale systems, one may practice this unique invention to form multilayer circuit "boards" by selective blister transport interconnection of adjacent circuit substrate layers. Thus, a programmable circuit board technology having many tens of layers becomes practical. A laser would be employed to selectively form contacts when and where desired, on any level, after lamination, of one or more layers, and would leave unconnected juxtaposed contacts to remain electrically open.

The transport mechanism utilized in this invention was reported recently at the 1981 CLEO conference in Washington, D.C. by both Minnesota Mining and Manufacturing Company and Thompson CSF. Both reports described a multilayer optical recording media consisting of a disc coated with a film which forms microscopic surface blisters, with high optical contrast, when locally hit with a small diameter laser pulse. Specifically, it was shown that when a thin metal layer a few hundred Angstroms thick, such as gold or platinum, is deposited on a thermodegradeable film such as polymethylmethacrylate or polysulfone and is hit by a micron-sized laser pulse, a micron-size blister appears in the film sandwich surface. The mechanism for blister formation is thought to be primarily outgassing of the buried thermodegradeable film which causes bulging of the gas-impermeable metal over-layer. Other mechanisms thought to contribute to blister formation are differential thermal expansion between the metal film and its outgassing and substrate layers as well as thermally induced stress relaxation/grain growth in the metal top-layer.

Such blistering material arrangements have been demonstrated as having the capability to reproducibly form approximately $10^{10}$ 14 $10^{12}$ identical blisters on one 12 inch diameter sample. Efforts in the optical-disc memory environment aim at producing the tiniest blisters, having the highest optical contrast, with the smallest laser possible, i.e. a semiconductor chip diode laser. The materials chosen for the blistering media must be extremely sensitive to the laser.

In contrast to the needs fo optical disc-makers the novel application of the blistering action to transport a circuit feature for subsequent bonding to a closely juxtaposed mating circuit feature, on a separate substrate, requires far less sensitivity and permits the use of commercial table-top lasers. Contacts to remain unconnected are not blistered and remain open. In a manner similar to the optical case it is required that the metal or other electrically conducting material forming the contact pad and its connecting trace be sufficiently ductile at the blistering temperature to resist cracking, bursting or otherwise rupturing.

The advantages of the present invention may be achieved, in one form, by using substantially standard IC chips in conjunction with a novel interconnection substrate. The substrate may comprise a laser transparent material on one side of which is provided an electrically conductive interconnection pattern including transportable contact pads disposed on a blisterable distortion layer. When excited, as by laser illumination through the optically transparent substrate, the distortion layer deforms in a direction away from the substrate, driving a selected contact pad therewith toward a closely spaced, mating contact pad on a face-down positioned IC chip.

A typical application might involve 100 chips each 0.100 inch×0.100 inch in size forming a 1 inch×1 inch "quilt" with each chip being spaced from the substrate by 10 microns. The mobile contact pads on the substrate would be about 20 microns in diameter on 60 micron centers as would be the stationary contacts on the chips. A 10 to 20 micron diameter Nd-YaG or argon-ion laser spot may be pulsed for a few tens of nanoseconds per pulse onto those contacts to be connected. By controlling the numerous laser and material parameters involved, one can transport the preselected contacts across the 10 micron gap by forming blisters approximately 30 microns in diameter beneath the mobile pads. The center-to-center spacing of contacts may be reduced further by employing patterned blisterable material.

It must be emphasized that this invention makes achievable extremely high density interconnections and interconnected elements, the selective programmability of the connection process, and the ability to make variable size connections on one circuit. By properly arranging the conductive traces extending to the mobile pad on the substrate surface, the problem of minimizing interfacial shear strains is straightforward. A total areawise, or gang blistering of complete circuit patterns is a simple extension of the individual contact bonding described, and is within the scope of this invention. In fact, gang blistering may be effected, in the absence of optical illumination, by the application of or in situ generation of thermal energy alone. Problems with signal propagation delay in present-day multichip systems may also be greatly reduced by the present invention, by lowering of individual trace parasitic capacitance simply by raising the substrate interconnect trace off its immediate substrate surface.

A more complete understanding of this invention and its advantages will be clear from the following description and claims taken with the accompanying drawings, wherein:

FIG. 1 is a sectional view of a typical prior art wire-bonding connection showing the stress pattern in the IC device present during bonding, FIG. 2 is a sectional view of a typical prior art tape-automated-bonding connection showing the stress pattern in the IC device present during bonding, FIG. 3 is a sectional view of a typical prior art $C^4$ inverted chip connection showing the post-bond stress pattern in the IC device and typical intrabond microcracking, FIG. 4 is a plan view illustrating the difference in size between a conventional prior art wirebond connection and one form of the blister bond connection of the present invention, FIG. 5 is a perspective view showing a number of IC chips mounted face down on the novel interconnection substrate of the present invention, FIG. 6 is a side elevation view showing a number of transported blister contacts having been formed between a portion of one of the IC chips and novel interconnection substrate of FIG. 5, FIG. 7a shows a pre-bond side elevation sectional view of a single contact to be formed between a substrate contact pad and an IC contact pad, FIG. 7b shows a post-bond side elevation sectional view of the single contact of FIG. 7a having been formed between the single substrate contact pad and a single matching IC contact pad, FIGS. 8a, b, c, d, and e are enlarged sectional views of various configurations of the blisterable stack on the substrate, FIG. 9 is a sectional view showing a single post-bond contact region between a mobile substrate contact pad and an IC contact pad, illustrating debris from the blisterable stack mainly on the mobile contact pad and limited amounts on the IC and the substrate, FIG. 10 is a sectional view showing a single post-bond contact region between a mobile substrate contact pad and an IC contact pad, illustrating debris from the blisterable stack mainly on the substrate and limited amounts on the IC and the mobile contact pad, FIG. 11 is a sectional view showing a single post-bond contact region between a mobile substrate contact and an IC contact pad, illustrating a diaphragm layer and its ability to continue providing contact support and act as a debris barrier.

Figure 5:
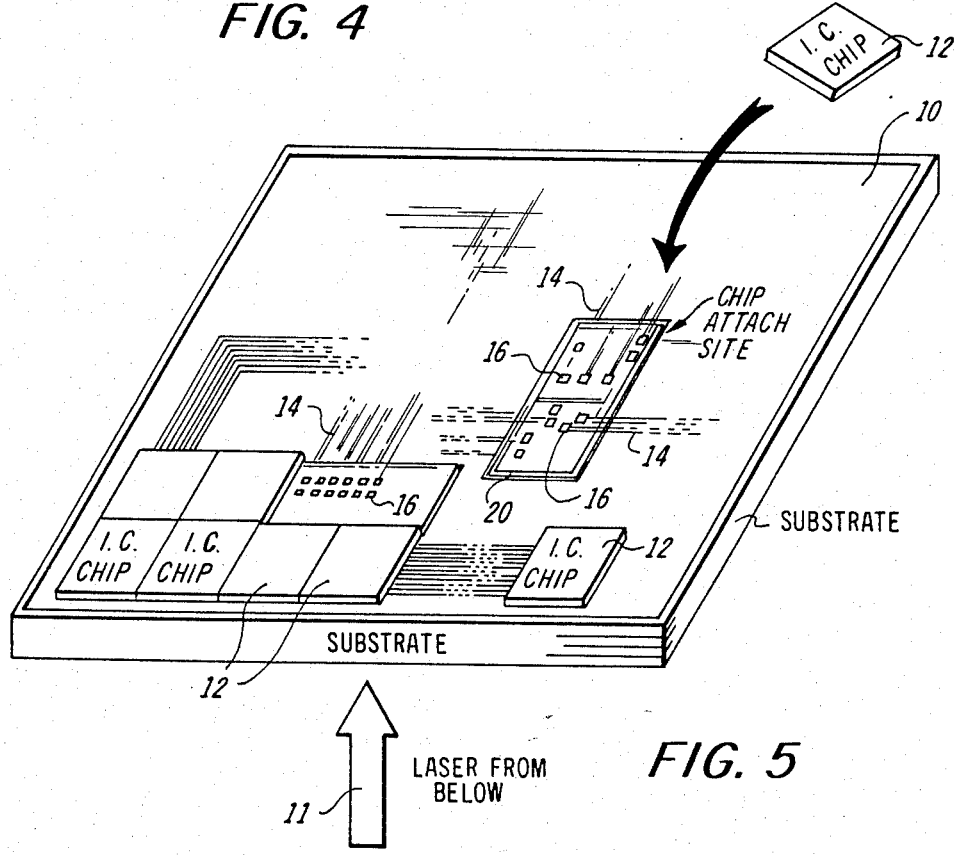
Figure 14:
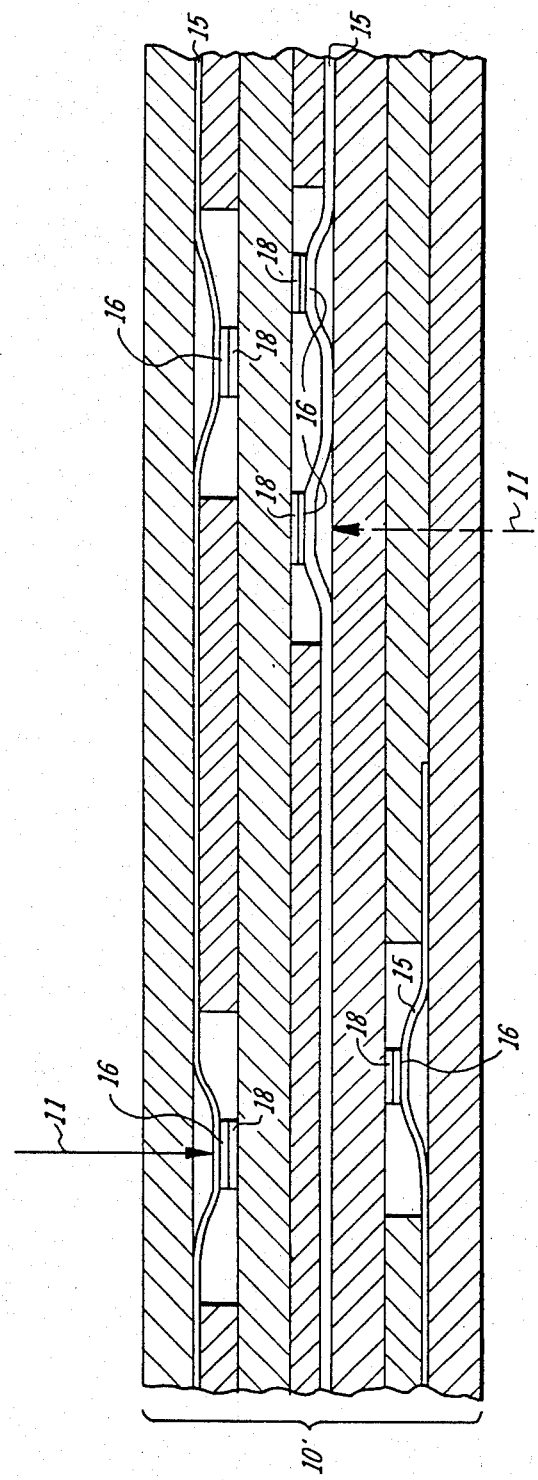
Figure 15:
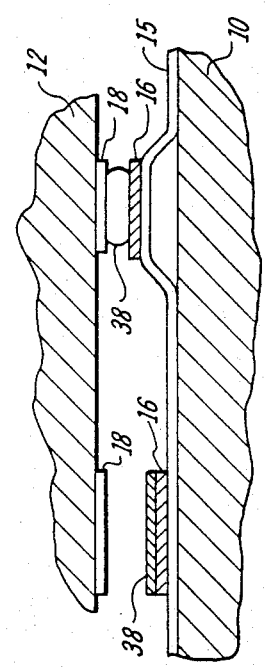
Figure 16:
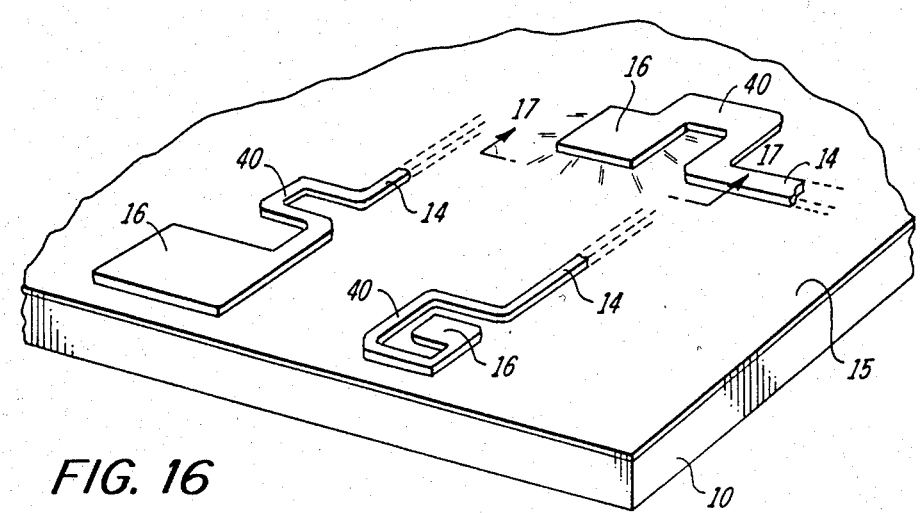
Figure 17:
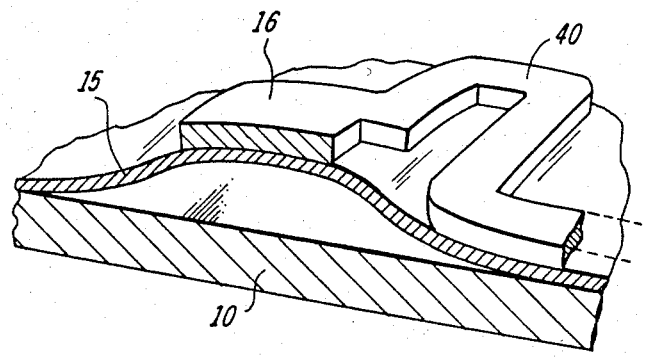
Figure 18:
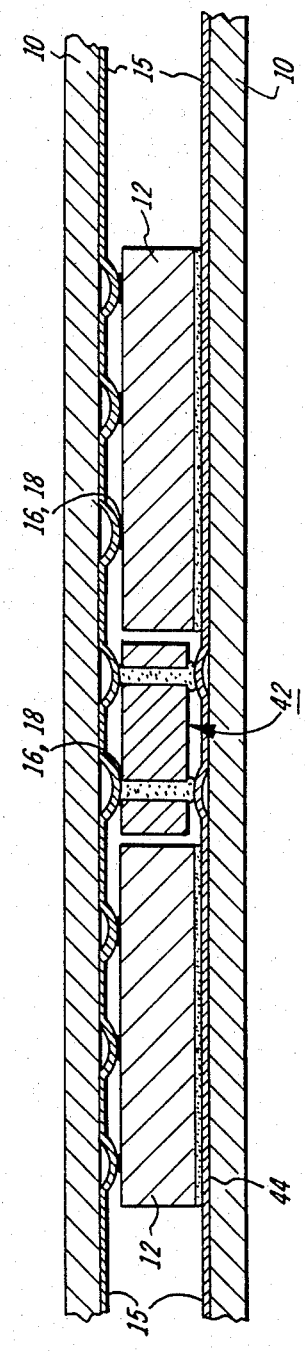
Figure 19:
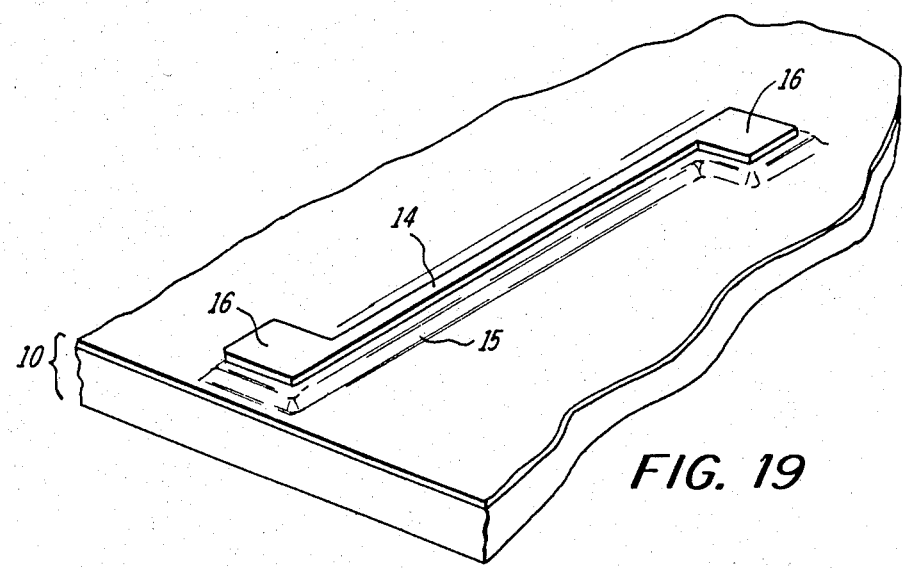
Figure 20:
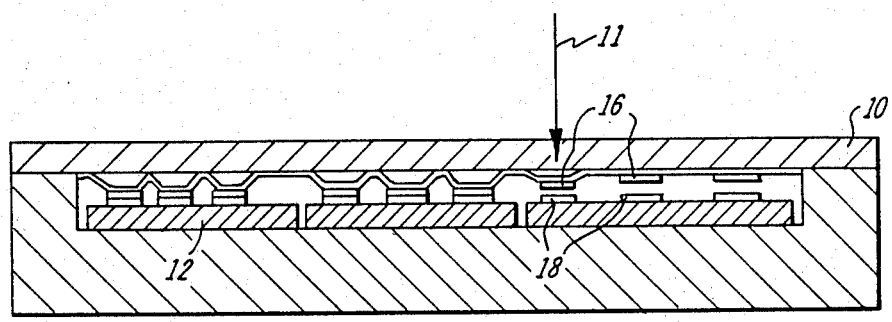
Figure 21:
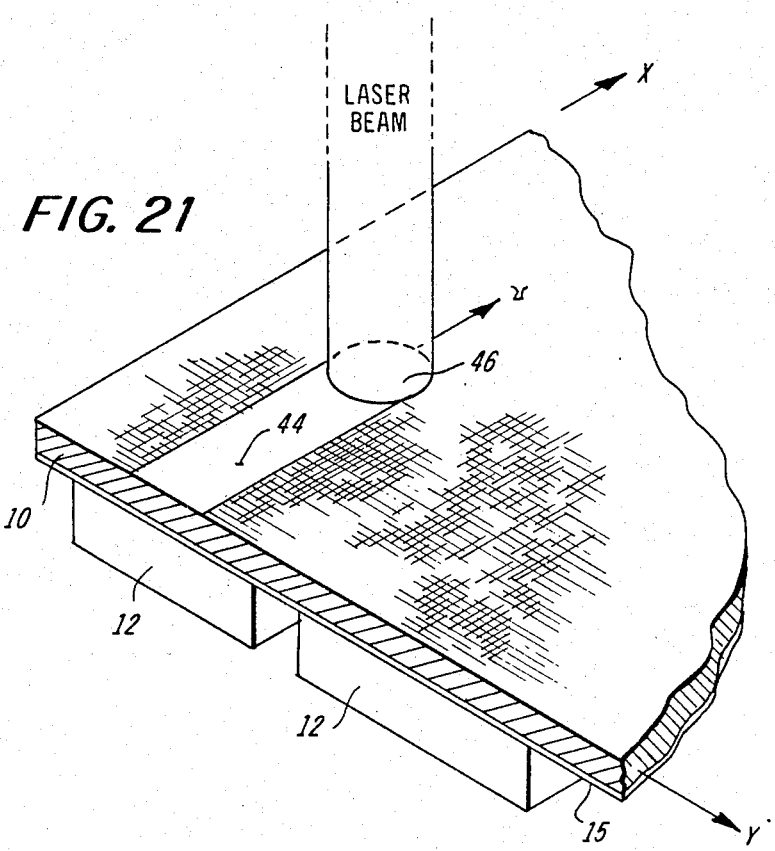
Figure 22:
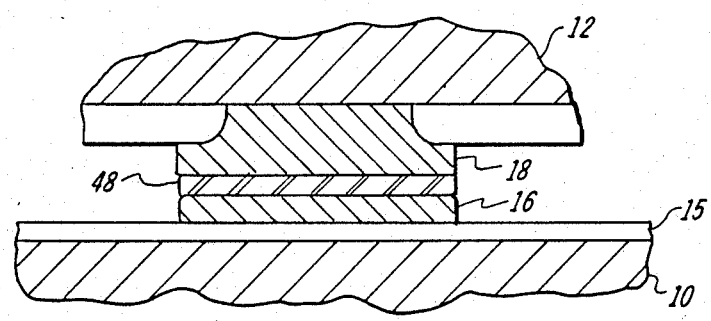

FIG. 14 is a sectional view of a multilayer version of the substrate of FIG. 5 wherein the interlayer contacts within the volume of the substrate are formed in the same manner as chip to substrate bonds, FIG. 15 is a sectional view showing a blister bond wherein a solder coating on the mobile contact pad reflows during interconnection, FIG. 16 is an enlarged perspective view of a portion of the substrate surface showing transportable contact pads and their connecting traces arranged to minimize trace stress arising from blistering and/or interfacial shear strain, FIG. 17 is an enlarged perspective view of a section taken substantially in the plane indicated by line 17—17 of FIG. 16, FIG. 18 is a sectional view of a hybrid assembly having several chips and substrates and incorporating jumper chips to make signal, power or ground reference contacts between substrate layers, FIG. 19 is a perspective view of a substrate interconnection trace with a mobile contact at each end showing in addition to the raised mobile contacts a raised trace for decreased parasitic capacitance, FIG. 20 is a sectional view of interconnections being made inside a hermetically sealed package by a radiation source external to the package, FIG. 21 is a perspective view illustrating area-wise blistering or grafting of interconnect pads and their associated traces by a walked CW laser beam, and FIG. 22 is a sectional view illustrating the addition of an insulating layer incorporated to prevent shorts between contact pairs, meant to remain open, at purposely small or "zero" gap distances.

Figure 1:
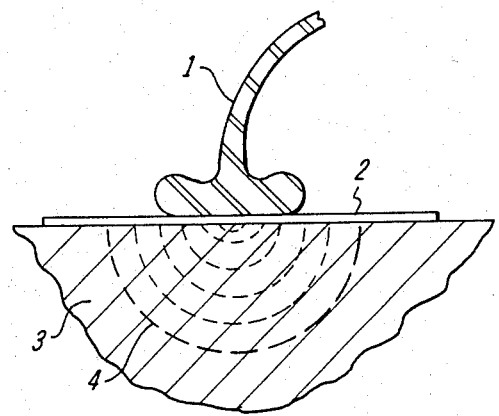
Figure 2:
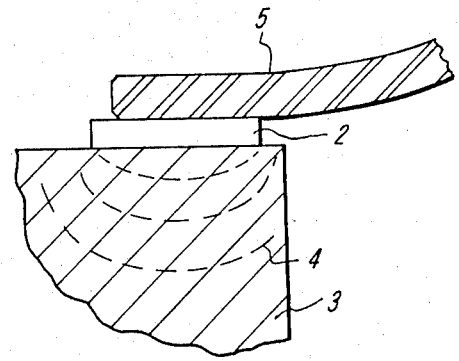
Figure 3:
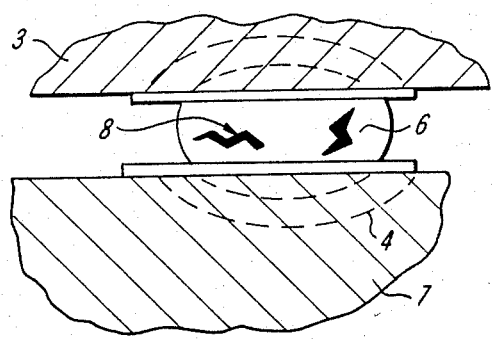

With specific reference to the drawings, there is illustrated in FIGS. 1, 2 and 3 sectional views of the prior art wirebond, TAB bond and an IBM-type controlled-collapse-chip-connection ($C^4$) inverted chip bond, respectively. The wire 1 of FIG. 1 is bonded to pad 2 on chip 3 and exerts appreciable, potentially damaging, stress on the chip during its connection. During the bonding operation, substantial vertical forces (in the 50 gram range) and ultrasonic scrubbing vibrations are involved, establishing stress gradients, indicated by dotted lines 4. Although the stresses will be substantially relieved upon completion of the bond-making process, research has shown that some subsurface silicon damage may remain permanently. Thus, wirebonding currently requires bonding pads 2 which are either not directly located over sensitive regions of the device or that are raised off the active device surface by a shock absorbing organic film.

The same general comments can be made about TAB bonding of FIG. 2. Here a tape held beam-lead 5 has been bonded to chip 3 on a bond pad 2. Stresses which exist during the bonding process are schematically indicated by isostress lines 4. Due to the gang-nature of the process, it is very difficult to equally set the force and vibration amplitudes accurately at each bond site. Any variation in the geometry of the individual bond site, in terms of the shape of the beam-lead 5 or bond pad height, cannot be compensated for except by brute force. An unexpectedly high pad thus receives unexpectedly high bonding forces. This can be tolerated by placing TAB bond pads in non-sensitive areas such as at the device perimeter. If the TAB process is contemplated for area-wise bonding, it will become even more imperative to keep the pads away from sensitive areas.

FIG. 3 illustrates a single IBM-type controlled-collapse-chip-connection ($C^4$) illustrative of that area-wise interconnect technology. Interconnect contact 6, takes the form of a surface tension shaped mass of reflowed solder, which couples chip 3 and substrate 7 in a co-wetting process as the gang-formation of the area-wise array of $C^4$ bonds is carried out. The $C^4$ bonds are susceptible to thermally-induced shear strain damage arising from the differing expansion coefficients between the chip 3, substrate 7 and reflowed solder interconnect contact 6. Isostress lines 4 are shown dotted as in FIGS. 1 and 2. These stresses occur after bonding and exist thereafter, as opposed to the force applied stresses arising during wirebonding and TAB, which occur mainly during the making of the bonds and may be relieved thereafter. Microcracks 8, created by high stresses, are shown schematically. They form in directions and under conditions which are very sensitively dependent on the height and aspect ratio of the reflowed contact. Contact materials, such as certain lead-tin alloys often employed, are prone to such cracking.

Figure 4:
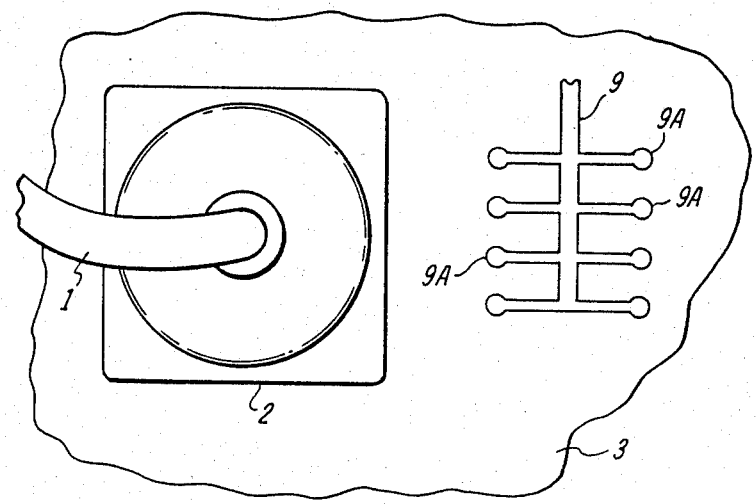

For purposes of comparison, there is shown in FIG. 4 a plan view of a conventional wire bond 1, as illustrated in FIG. 1 side-by-side with a blister-bond structure 9 made in accordance with the present invention. The structure 9 is ready to be held in proximity with an overlaid chip to which the mobile contacts 9a may be connected. The form of the circuit structure 9 is only representative and may be a power feeding tree having a number of separate delivery branches. The point being made with this Figure is the scale reduction made possible with the blister bonding technology described herein. Each mobile contact 9a, of FIG. 4, is about 8 microns in diameter on 20 micron, nearest neighbor, centers.

The blister bonding process of the present invention is an inherently gentle interconnection technology, both during and after bond formation, as will become apparent. It will be possible to place interconnection sites of any size and shape anywhere over the surface of the IC chip. In the case of mismatched thermal expansion coefficients between a chip and its substrate, substantial interconnection contact stress relief may be introduced by optimizing blister shape and location, gap size, trace shape and trace and contact thickness.

Figure 6:
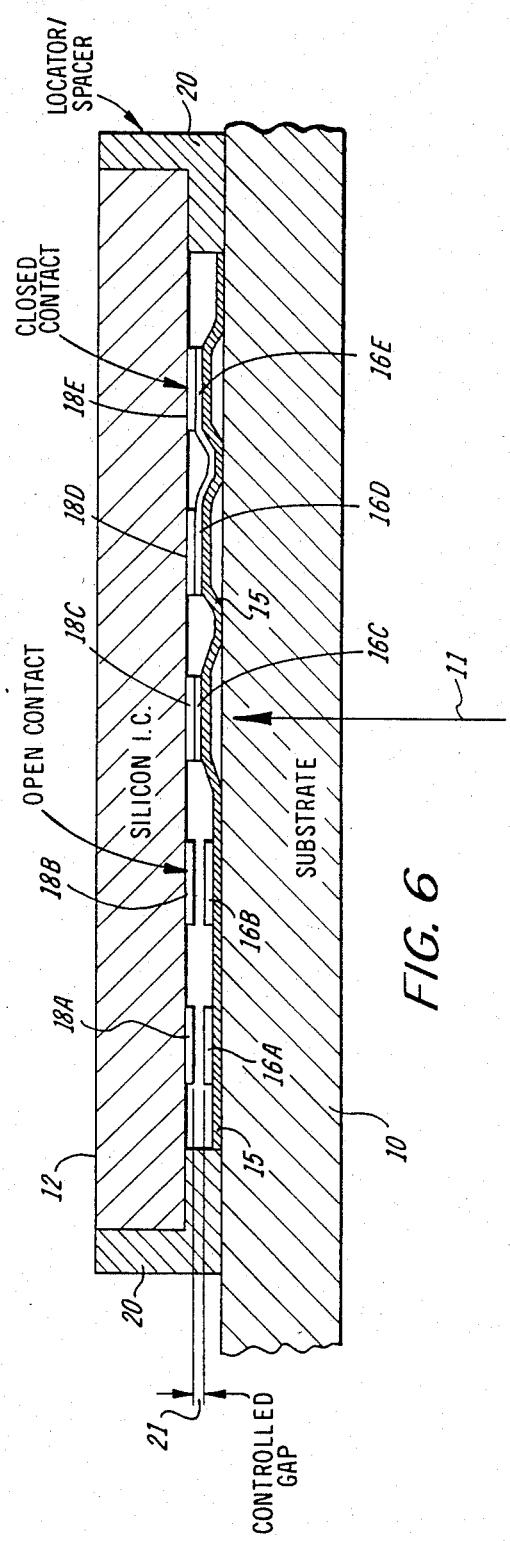

There is illustrated in FIGS. 5 and 6 the unique high density interconnection substrate 10 upon which are surface-mounted, in face-down fashion, a plurality of integrated circuit (IC) chips 12. A pattern of electrically conductive substrate circuit traces 14 terminating in blister-bondable contact pads 16 is situated on the top surface of the substrate 10 such that, when chips 12 are prepositioned for interconnection, the substrate contact pads 16 are in registration with the appropriate chip contact pads 18. The chip to substrate registration may be provided by a standoff or spacer 20, which is shaped like a frame, against which the precision cut edges of the chips locate. It should be apparent that, if desired, the traces 14 may be covered with a protective layer with only the blisterable contacts 16 being exposed. As shown, the chips may be packed extremely closely when necessary to minimize interchip signal propagation delay and distortion. In general, the optical radiation, indicated by arrow 11, triggering blistering and normally also contact bonding is directed at the underside of substrate 10 and impacts on the blister areas after passing through the optically transparent substrate thickness.

With particular reference to FIG. 6 it can be seen that substrate 10 supports movable contact pads 16 upon blisterable stack layer 15 (to be more fully described below). The IC chip 12 bearing contact pads 18 is in face-to-face relationship to and overlies substrate 10, being maintained remote therefrom by an amount equal to gap size 21 defined by standoff 20 which may be integrally fabricated with substrate 10. Alternatively, the standoff may be fabricated as part of the mountable item, i.e. chip 12. A significant advantage of the present invention is the ability of the blistering action to move a contact pad over a range of gap sizes. This feature makes the uniformity and even the magnitude of gap 21 not very critical, a tremendous manufacturing advantage. Furthermore, gap 21 leaves unblistered matching contacts electrically open and thereby offers another manufacturing and design advantage, that of programmability.

Figure 7A:
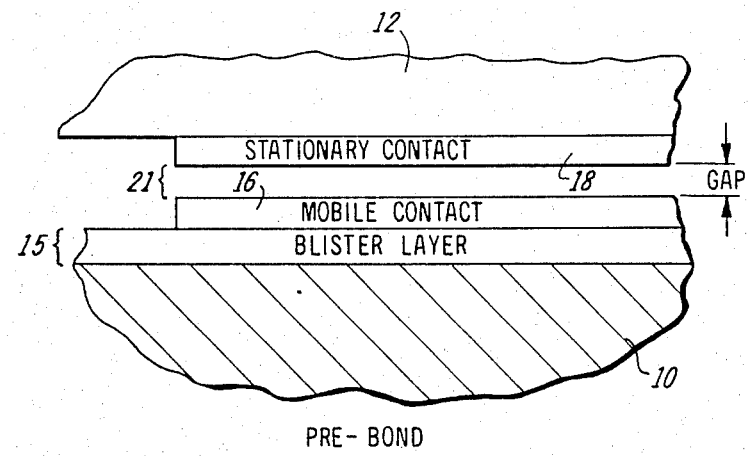
Figure 7B:
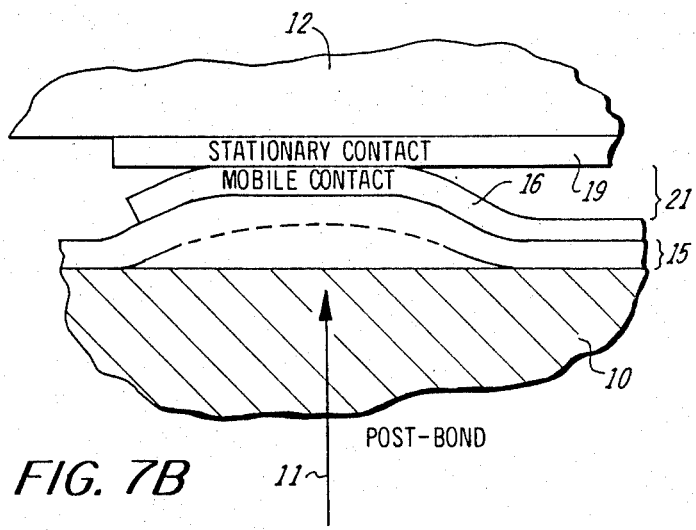

Viewing from left to right, identified as contacts a through e, substrate contact pads 16a and 16b are shown in their undisturbed, electrically open, condition. These have not been blistered into contact. Substrate contact pad 16c is shown just as it completes its blistering due to laser pulse 11 driving it toward and fusing it to matching IC chip contact 18c. Further to the right are two other closed pairs of matching contacts, namely 16d/18d and 16e/18e. Thus, the directed laser beam 11 has selectively caused three of five available sets of contacts to be blistered and subsequently bonded together to form three separately programmed electrically closed contacts. In order to clearly see the blistering mechanism, there is illustrated in FIGS. 7a and 7b an enlargement of a single blister contact before and after contact has been made. The underside of blisterable stack layer 15 in FIG. 7b has been shown as a dotted line to indicate that the post-bond structure of that layer may have many forms (FIGS. 9-12) depending on stack design and energy input conditions.

Applications such as that depicted in FIG. 6 would employ IC chips 12 whose surface flatness is in the few micron (e.g. 2-6) range. Substrate 10 could, for example, be fabricated of a sapphire, quartz or borosilicate glass polished and lapped blank, locally flat to a few microns. Since chips can be made small, the substrate flatness, on a global scale, is determined primarily by the lithographic technology employed to form interconnection traces 14 and contacts 16. With such flatnesses economically available, one could interconnect 10 micron pads on 25 to 35 micron centers across a 5 to 15 micron gap. This would permit 45,000 interconnections to be made to an IC chip a quarter-inch on a side.

Commercially marketed computer-driven laser fuse blowing equipment is presently capable of finding and cutting metal links with dimensions of a few microns. It is contemplated that this, or similar, equipment could be used to cause the selective blistering of the present invention. However, the laser investment could be obviated by practising this invention with optical energy being supplied, for example, by infra-red, tungsten-halogen, or pulsed xenon lamps or graphite strip heaters in combination with an in-situ reflective mask. In such a case, the mating contacts would be designed to fuse at a moderately low temperature, typical of many solders. As the blanket radiation "sees" all the blisterable areas situated over windows in the mask layer, this approach eliminates the programmable selectivity provided by the laser approach. Another non-selective or blanket contact driving approach is that enabled by oven heating or vapor-phase condensation heating of a substrate and its mating chips, wherein the substrate bears selectively deposited or otherwise patterned blistering material underlying only the mobile contact pads.

Several permutations of the "stack" of films making up a blistering system of the invention, each having unique advantages, will be described. The principal object is almost always to transport the mobile contact pad and to fuse it to its counterpart pad with great repeatability, precision and reliability at high density, low cost and usually in a selective fashion. This means that the blistering action at one contact should have no harmful effect on its neighboring contact sites, be they blistered or unblistered. It also means that a degree of control is required and that the objects being interconnected cannot themselves be degraded by the blistering activity. In achieving these goals the variety of film layers found in blisterable stacks may include one or more of the following:

1. Propellant Layer—This layer is itself converted, at least in part, usually selectively, into blister propellant gas via thermal decomposition and outgassing, triggered by the blistering energy input.
2. Absorber Layer—This layer insures depth-localized stack absorption of radiation at a stack interface at which the deposited thermal energy can efficiently decompose (outgas) propellant material.
3. Thermal Insulator Layer—This layer makes it difficult for the deposited thermal energy to move in any direction other than into the propellant layer.
4. Reflector Layer—This layer enhances thermal efficiency by causing multiple pass absorption of the radiation.
5. Supporting Diaphragm Layer—This layer provides a delaminating or deforming film which when deformed by gas generated in an adjacent propellant layer, provides a contiguous mobile supporting surface to carry the moving contact.
6. Reflector/Mask Layer—This layer patterns blanket radiation such that the blisterable stack is presented with patterned, simultaneously "directed" blistering radiation for gang bonding.
7. Gas Barrier Layer—This layer decreases the gas permeability of the stack and thus insures that the generated gas achieves maximum pressure and minimal leakage away from the contact site.
8. Interconnect Traces/Pads—This layer consists of interconnection circuit traces and associated mobile contact pads the purpose of which is to electrically interconnect the IC devices in the desired manner.

The thickness of each of these layers is largely determined by its respective mechanical, thermal, optical and electrical requirements. Since the expectation is that bonds ranging from 1 micron to 1000 microns in diameter will be employed in industry, a correspondingly large variation thicknesses from application to application is expected. Generally, however, film thicknesses in the range of a few Angstroms to a few tens of microns will be utilized. Mainly, certain of the film thicknesses don't necessarily scale with the bond sizes, but are determined primarily by the laser wavelength, as in the case of a multiplayer optical absorber film. Others, such as the thermal insulator film, scale in thickness with the thermal diffusivity of the substrate; and the diaphragm layer scales in thickness with, among other things, the gap size, bump aspect ration, contact spacing and gas pressure.

Figure 8A:
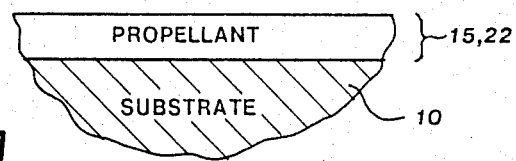

FIGS. 8a, b, c, d and e show a few of the many possible forms the blisterable stack 15 (the mobile contact pads normally disposed thereon are not shown) may take as comprehended by this invention. In FIG. 8a propellant layer 22 alone overlies substrate 10 and might consist of a PMMA (poly methyl methacrylate) film on a borosilicate glass or sapphire substrate. In an esoteric application, the substrate 10 could be conditioned to eliminate any additional propellant film, such as by relying on the phenomenon of back-surface laser-induced explosion, so that the substrate itself, or at least a treated portion of its surface, becomes its own propellant. The surface of substrate 10, on which the transportable contacts 16 are placed, could be roughened, chemically converted or ion implanted to preferentially induce formation of back surface plasma or ejecta, typical of known back-surface drilling techniques.

Figure 8B:
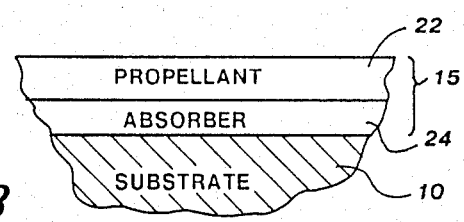

FIG. 8b shows a substrate 10 supporting a propellant layer 22 and an absorber layer 24. The absorber layer causes additional quantities of radiation to be absorbed, and is particularly beneficial in the case where the propellant itself is an excellent gas-generator but a poor optical absorber. Obviously, it is desirable to place the absorber layer or layers where the heat absorbed thereby will easily be transferred into the propellent. It is even possible to physically mix propellant and absorber materials to form a single film. In such a case, the intermixed absorber might take the form of an organic dye or an inorganic filler.

Figure 8C:
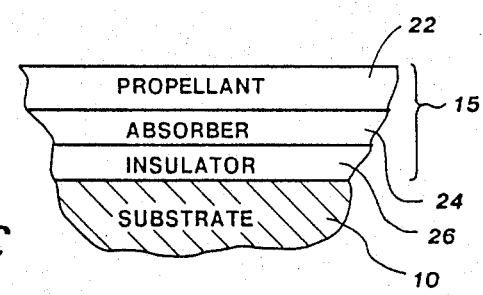

FIG. 8c shows blisterable stack 15 comprising propellant 22, absorber layer 24 and thermal insulator layer 26. The purpose of the insulator layer, which may for example comprise a deposited silicon dioxide film, is to keep the thermal energy, deposited in absorber 24, from diffusing faster to the thermally conductive substrate 10 than to the propellant 22.

Figure 8D:
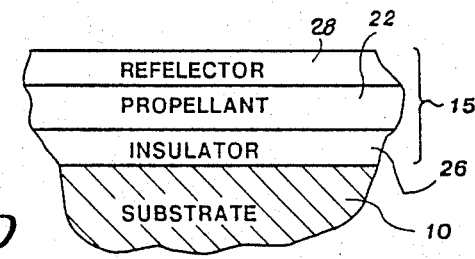

FIG. 8d shows a blisterable stack 15 made up of reflector layer 28, propellant layer 22, and insulator layer 26. In this case the reflector causes multiple pass absorption of the radiation in the propellant, to increase the efficiency of thermal energy input thereto.

Figure 8E:
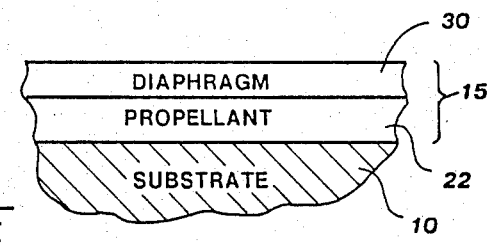

FIG. 8e shows blisterable stack 15 made up of diaphragm layer 30 overlying propellant layer 22. The purpose of diaphragm layer 30 is to provide a movable and generally contiguous support surface for the mobile contact pad. The diaphragm, for example, a polyimide or silicone film can be arranged to remain continuous and unperforated even after blistering and bonding. Its prime requirements are that it be readily deformable, thermally stable, and resistant to the tendency to return to its original shape after exposure to the bonding conditions. A significant post-bond "memory" in the material would strain the effected bond between contact pads 16 and 18. The diaphragm layer must also withstand the forces due to contact impact and gas induced pseudostatic loading of contact pads 16,18 as well as to withstand the locally high temperatures. Diaphragm laye 30 is particularly beneficial when the gas-induced contact loading period is to be prolonged for bond-making purposes.

The post bond section illustrated in FIG. 7b shows a blisterable stack 15 having transported mobile contact pad 16 to stationary contact pad 18 across gap 21. The portion of the blisterable stack 15 beneath contact 16 is shown in dotted lines in order to point out that the blisterable stack may have many forms depending on the stack design and the energy input conditions.

Figure 9:
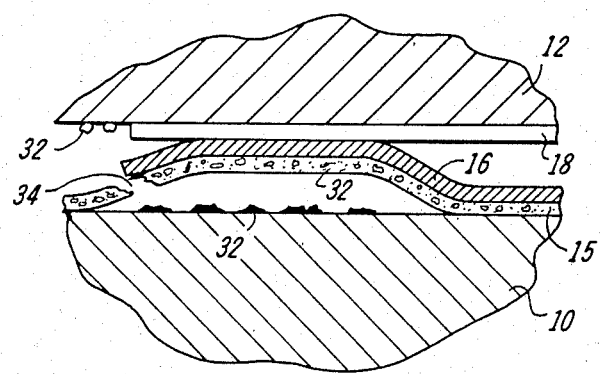

For example, FIG. 9 shows one particular post-blister structure wherein the majority of debris 32 associated with the expended blisterable stack 15 has remained on the underside of the mobile contact pad 16. The debris may consist of unused and/or chemically converted propellant, absorber and/or insulator material. Small amounts of debris 32 also may be found on the chip 12 and substrate 10. The blister stack material which does transport with mobile contact 16 is generally characterized by bubbles, voids or ruptures 34. As illustrated, some debris 32 deposits itself on the surface of chip 12. Insofar as this may be detrimental to the performance of the IC chip, the chip may be protected by the addition of a suitable protective coating layer.

Figure 10:
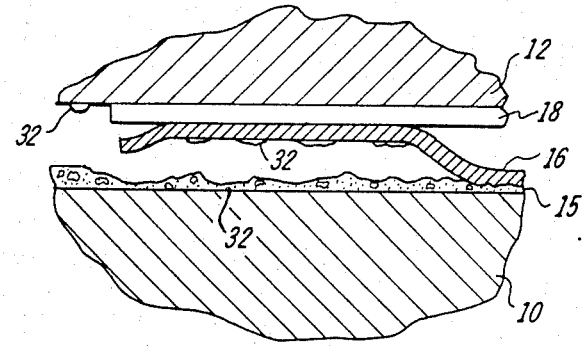

FIG. 10 shows another post-blister structure wherein the majority of blisterable stack debris 32 remains on the substrate 10 with only a limited amount of debris traveling with the mobile contact pad 16, and again some debris on the chip 12. Voids, ruptures and bubbles are evident in layer 15.

As shown in FIGS. 9 and 10 there may remain no sustained contiguous blister supporting the transported contact and connecting trace in the high energy limit. These may aptly be described as configurations wherein an exploding propellant rapidly ejects and transports the mobile contact. In this embodiment the time necessary for metallurgical bonding must be short, since the gas generated is not well confined. By filling the gap 21 around mobile contact regions (taking care not to cover them) with a material that is sufficiently compliant to relieve interfacial shear strains, yet sufficiently viscous, it is possible to retard the escape of propellant gas. A polyimide or silicone material could be employed for this purpose.

Figure 11:
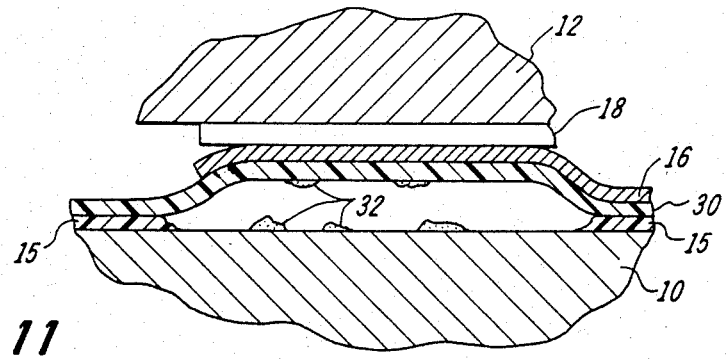

FIG. 11 shows a diaphragm layer 30 left intact after blister bonding has taken place. Some debris 32 from the remainder of the blistering stack 15, of which the diaphragm represents the top layer, is present but does not escape to the remainder of the system. Additionally, since the diaphragm layer is intact it may serve to offer mechanical support for the conductive trace 14 leading to the contact pad 16. The diaphragm may be employed also as a gas barrier to prolong mating contact force in those situations where metallurgical bonding requiers more time for thermal energy absorption in contacts 16 and 18. Thus, the pressurized gas is retained long enough to allow contact pad 16 to transport over to contact pad 18 and bonding to take place, under sustained temporary contact pressure. The diaphragm structure of FIG. 11 would typically involve longer bond times and lower kinetic energy than the bond structures shown in FIGS. 9 and 10. A separate diaphragm layer may not be necessary to achieve continuing support by a contiguous blister in the lower bond energy spectrum.

Figure 12:
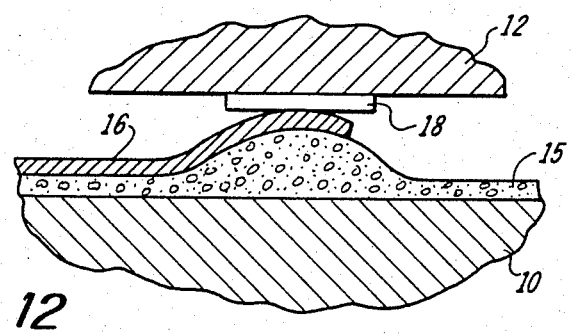
FIG. 12 is a sectional view showing a post-bond sponge-like blister structure supporting the mobile contact pad.

Yet another form of the blisterable layer 15 is illustrated in FIG. 12. It involves a material which expands or swells into a porous foam-like sponge structure upon the application of suitable radiation. The resultant (post bond) structure, in addition to providing transport for the contact pad 16, also retains a firm mechanical support therefor. In this version, the blisterable film is characterized by the nucleation and growth of dispersed unconnected bubbles in a gas impermeable closed-cell foam-like sponge. Dispersed absorbers may enhance the formation of this structure.

Figure 13:
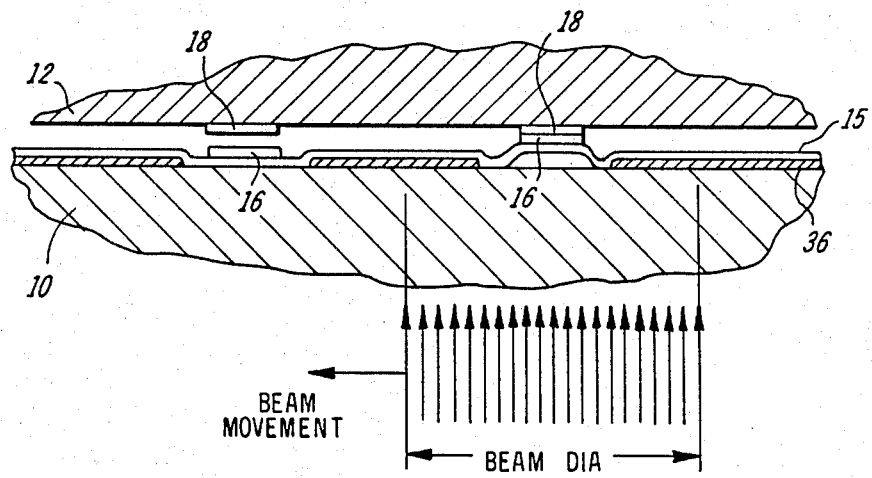
FIG. 13 is a sectional view showing a masking layer substrate configuration for permitting radiation beams of diameters larger than the interconnect size, possibly of a blanket nature, to be employed.

FIG. 13 shows an in-situ masking layer 36 which permits directed radiation to be larger in spot size than the blisterable area of one contact. Layer 36 should be as highly reflective to illumination and as poorly thermally conducting as is practical and may comprise a chromium/silicon dioxide sandwich a few hundred Angstroms thick. A large diameter beam may be scanned or stepped and pulsed to form simultaneously regions of numerous contacts. Alternatively, the beam may take many forms of blanket optical radiation, in which case all contacts are formed simultaneously.

It is important to note, that although this invention has been primarily described relative to the joining of contacts on substrates 10 and 12 it relates broadly to an improved method of microinterconnection. Included in the scope of the invention are those cases wherein the blister bonding actually takes place between layers of a multiplayer "PC board". FIG. 14 shows one version of substrate or "board" 10, wherein multiple layers of blisterconnected circuit traces are disposed. Internal, inter-layer mobile contacts 16 have been selectively blister bonded to stationary contacts 18, from both sides of the board, as required. The resultant product is a multilayer hybrid substrate, selectively interconnected.

Inherent in the invention is the ability to tailor the bonding process itself, which may range from being purely or mostly mechanical, as in cold welding or ultransonic/thermosonic welding, to being totally thermal in nature as in fusion by melting or solder reflowing. By exposing a properly selected blisterable layer 15 to one or more very short laser pulses one may rapidly transport the mobile contact such that it not only impacts the stationary contact with signifcant impulse force but there is induced very high short-term contact forces due to momentarily high gas pressure after impact. This may be viewed as a purely mechanical bonding event, which is an extreme situation of maximized impact force, resulting from rapidly built-up gas pressure acting on a low inertia contact pad. Most applications would, however, sensibly involve an appreciable thermal component. Even with extremely short pulses the blisterable stack may be arranged such that the mobile contact is appreciably heated by the time it reaches its mating stationary pad. A set of characteristic time constants for thermal diffusion, absorbtion, gas generation and gas escape may be calculated for estimating the behavior of a particular stack design.

The opposite extreme case, wherein bond making is essentially thermal in nature is illustrated in FIG. 15. The blisterable layer 15 is arranged such that the majority of the energy absorbed goes directly to heating and/or melting the mobile contact pad 16. Some thermal energy is absorbed either directly into the blisterable stack or is conducted into the stack from the mobile contact undergoing heating. The blisterable stack moves the mobile contact comparatively slowly to a comparatively gentler contact pressure impact with stationary contact 18. Blisterable stack 15 need only insure a low pressure intimacy sufficient for the two pads to fuse together. One commonly employed arrangement would involve a solder coating 38 on pad 16 and possibly also on pad 18. The solder 38 is melted either during the period of mobile contact transport or after it arrives against stationary contact 18. The solder employed, perhaps lead/tin, indium alloy or gold/tin, may be effectively splat cooled and simultaneously fused as a result of hitting contact 18 in a preheated state. The solder may reflow as with $C^4$ bonding, thus further reducing the amount of pad travel necessary. Most applications will fall between the two indicated extremes and will include both mechanical and thermal components in order to be mechanically gentle yet still guarantee a metallurgically sound bond and retain a degree of insensitivity to process parameter variation. Thus, the bonds of FIGS. 9 and 10 represent higher energy, faster and less gentle bonding processes than that of FIG. 11.

Blister Material Considerations

There are numerous blisterable materials available. Of primary consideration, for utilization in the present invention, is the amount of and rate at which volatile gaseous products can be evolved at temperatures in the range of a few hundred degrees Centigrade. Nitrocellulose and PMMA are both excellent blistering materials due to their rapid depolymerization and extensive outgassing the 200°–400° C. range. Much is known about the sequence of molecular breakdown of these two blister materials as well as others such as α-methyl styrene, PVC and polysulfone. However, some of these materials give off corrosive by-products as a result of the thermal breakdown process and might conceivably endanger sensitive circuitry. Since the blister-bonding application does not require the sensitivity of the optical disc application, one can afford to choose materials of far less sensitivity which yield less harmful by-products, such as $CO_2$, $NO_2$, $H_2O$, $H_2$ etc. or insignificant quantities of less desirable by-products. Certain materials currently in use in the semiconductor industry such as photoresists, polyimides, silicones and cellulose acetate show some promise.

If the thermodegradeable gas generating material being considered for a particular application has poor thermal or optical properties, corrections can be made, in most cases, by tailoring the blistering stack by incorporating appropriate absorptive and/or reflective films, fillers or dyes or by thermally insulating or sinking the blistering structure to obtain the desired heating rate.

Clearly, the outgassing material needs to be stable with a long shelf life in its unblistering condition. In the case of a multilayer circuit substrate application, wherein the mating contacts can be hermetically sealed, this is less important. The blisterable material should be thermally stable at temperatures reached during the formation and patterning of the top interconnect trace film. Evaporation, sputtering and electroplating temperatures may be kept well below 150° C. in depositing the interconnect film. If the interconnect film is patterned by chemical or plasma etching techniques, the blisterable material must remain protected or otherwise impervious to attack by those processes.

Variations in blister stack configuration and the type of exciting radiation utilized to form a given blister bond contact geometry are fully within the context of this invention. For example, some blisterable propellant materials may be arranged so that optical energy absorption therein is sufficient to drive it, while other materials, which are poorly optically absorbing, may be thermally driven by heat absorbed in the adjacent absorber tuning materials. Thus, to form a given blister bond, one blisterable material may require addition of enhancement layers to the stack wile another is satisfactory alone.

Metallic Component Considerations

The circuit interconnect pattern residing on the contact face of the substrate is expected to be fabricated in accordance with procedures currently applicable to the manufacture of thin-film or thick film hybrid substrates or IC devices. In addition, the interconnect traces on the surface must exhibit at-temperature ductility during the distributed deformation that the blister inflicts. No appreciable quantities of brittle intermetallic phases such as is found in the gold-aluminum system should be incorporated in the bond itself. A simple contact metallurgy might involve solder-to-solder, gold-to-gold or aluminum-to-aluminum bonding at the contact interface. Solder coating to reduce contact bonding temperatures will be desirable in many cases. Platings may enhance wettability. In general, the rapid speed of laser pulse bonding will permit normally difficult combinations of materials to be bonded. Metastable phases and structures tend to dominate due to the lack of time in which diffusion may take place. Refractory metal traces and dissimilar materials may also be bonded. The very short laser pulse lengths permit extremely shallow bonds to be made.

Metallic layers used as reflectors such as aluminum, titanium, copper or chromium may be employed to increase absorption in the blistering material or to form an illuminated pattern from a blanket exposure of radiation.

Blistering Radiation Considerations

In the preferred form, when a laser is used, the primary considerations are wavelength, mode, intensity, pulse shape and pulse frequency (if pulsed), spot size and placement accuracy (if directed beam). A laser beam is employed in the case of selectively closing individual contacts. For gang-bonding of numerous contacts simultaneously, infrared lamp, pulsed quartz-tungsten halogen lamps, xenon flash lamps or graphite strip-heaters may be employed. In a gang-bonding soldered approach, a vapor-phase soldering or oven soldering operation causing swelling of the blistering layer is also practical. In such exceptional cases no optical illumination whatsoever is employed. Blanket energy input methods, such as microwave and RF heating may be useful for specialized applications.

In the general case of directed laser irradiation, Nd:YaG, Nd:glass, argonion, ruby, $CO_2$ gas, xenon-ion, He-Cd, and AlGaAs solid state lasers have been used to form either optical disc pit or blister recordings or microscopic welded joints, or both, and are applicable. Many of these laser beams easily deposit energy in tuned thin film absorption structures after passing through a glass, plastic or other optically transparent substrate material, and their wavelengths in approximately the 0.4 to 1 micron range, with the exception of $CO_2$ at 10.6 microns, permit extremely small diffraction-limited spot sizes.

A pulsed laser may repeatedly cause multiple impacts which scrub away oxides in a mainly mechanical approach. The use of more than one laser in sequence may be practiced in those cases wherein transport is optimized with one wavelength and fusion/bonding with the second. When pulsed, the individual pulse lengths employed normally would be a few tens of nanoseconds long. If this is found to be insufficient, longer microsecond pulses, or a longer series of shorter pulses may be employed. If desired, a train of modulated pulses may be employed to limit thermal diffusion. Typically, $10^{-9}$ to $10^{-7}$ second pulses will be implemented with Q-switching techniques. Modern laser fuse-blowing systems can place kilohertz-rate Q-switched pulses with one micron position repeatability. Lower energy bond configurations involving solder may involve longer millisecond-range laser pulses. The pulse lengths and pulse trains employed depend on the structure to be bonded and its particular set of thermal and physical time constants. It is expected that blister stacks requiring individual pulse lengths in the $10^{-9}$ to $10^{-3}$ second range will be employed, given the tremendous range in size and structure of blister-bondable contacts of potential industrial usefulness.

If thermal energy is to be supplied by a non-selective method, such as convective oven heating or graphite strip heating, modifications must be made to the blisterable layer to compensate for the non-patterned, non-selective, energy deposition. One possible approach might be the provision of a blisterable sandwich comprising a patterned propellant layer overcoated with a diaphragm layer, with the propellant located only below mobile contacts.

In order to minimize mechanical loading of the conductive trace 14, due to both blister deformation and thermal expansion mismatches, it may be configured as illustrated in FIGS. 16 and 17. Substrate 10 with its blisterable stack 15 carries several mobile contacts 16 and conductive lead-in traces 14 which have jogged portions 40 close to the mobile contact pads. One contact 16 has been blistered and is shown in section in FIG. 17. The jog 40 makes the trace 14 less susceptible to cracking caused by the upheaval of the blister and by interfacial shear strains caused by differential expansion of substrate 10 and chip 12. Trace jogging might not be necessary if the blister shown in FIG. 17 were raised slightly left of the center of pad 16. In such a case, the metal trace would be deformed mainly in compression, with any existing low tensile stresses being insufficient to cause cracking. This is especially true for ductile large-grained metals.

A variety of other approaches to keeping blister induced trace stressing to a minimum are available. For example, one could keep the gap travel distance small or share it equally between two opposing mobile contacts. Small gaps, however, increase interfacial shear strains given a fixed expansion mismatch. Purposely causing the adhesion between trace 14 and blisterable layer 15 to be poor would also limit the maximum amount of stress which could build up. In fact, in many cases it will be desirable to either completely incinerate or vaporize blisterable layer 15 in the vicinity of contact 16 and trace 14 such that any visco-plastic memory effect, characteristic of layer 15, cannot later pull the contacts apart.

FIG. 18 shows two chips 12 sandwiched between two substrates 10. This could represent a portion of one layer of a three dimensional structure of stacked chips and substrates. A jumper block 42 is introduced to pass signals or power between the substrates. Such a jumper may consist of an insulator such as alumina or sapphire with plated-through and possibly solder back-filled through vias. Connections to jumper 42 may be made in the same high density manner as to the chips themselves. This figure clearly illustrates that extremely high density interlayer connections are possible utilizing the invention. Interlayer connections may also be achieved with an interposed windowed layer which not only passes signals through its thickness between layers 10, but provides a separate window cavity for location of each chip.

Since blister bonds of any desired shape or form are possible, the electrical parameters characteristic of a bond and its connecting trace may be optimized. These parameters include resistance, capacitance and inductance. Matching contact parameters, for example, perfectly matching impedances, becomes practical.

FIG. 19 shows an interconnection trace 14 terminating in two mobile contacts 16 residing on substrate 10. By blistering the trace 14 away from the substrate 10, the parasitic capacitance between the trace 14 and substrate may be substantially reduced and/or matched with its neighboring traces. Parasitic capacitance is at present a fundamental limitation to device performance. The blistering process of this invention thus provides for both ultradense programmable interconnection and signal propagation improvement. Application of this concept to form microstrip and microwire-type constructions is within the scope of the invention. Obviously since the blister may have a variety of heights it becomes possible to tune signal propagation times of traces of differing lengths by either uniformly raising one trace more than another or by raising only segments of a trace. Applications involving raising segments of a trace resulting in purposely distributed patterns of parasitic capacitances along or on a trace have potential applications as passive components.

In FIG. 20 is a hermetically sealed multi-chip package inside of which contacts 16, 18 are being joined selectively by a laser 11 external to the package. Substrate 10 is actually both a blister-interconnection means as well as a hermetic barrier and laser window. Hermetically sealed blister-bondable hybrid devices have the advantage that they can be modified or reworked at any time without opening the package. Furthermore, the atmosphere or environment surrounding the blister bond during its formation can be controlled. This has potentially favorable metallurgical implications in terms of the bond microstructure. The package sealing process must be arranged so as not to metallurgically disrupt the unblistered mobile and stationary contacts.

The variety of materials and configurations employable to achieve microinterconnection by blister bonding is vast. Within the scope of this invention are applications wherein the propellant, into which energy is to be coupled, may be a gas, liquid, solid or emulsion which has high vapor pressure at high temperatures and has a long shelf life at room temperature. As an example, the propellant may merely be a void filled ith a liquid or a gas, such as water, air or nitrogen. Under proper conditions, heating of such a void will cause the liquid to vaporize or the gas to rapidly expand to produce the blistering motion in an adjacent blisterable stack containing no propellant film.

A blisterable area may be energy coupled at different energy levels at different times to provide different results. For example, an initial low energy input can move the mobile contact pads to effect temporary physical and electrical contact with their corresponding stationary pads for electrical chip-testing purposes. Application of higher energy radiation could later permanently make the bonded connection.

FIG. 21 shows a substrate 10 with blisterable stack 15 and pre-aligned chips 12. An area 44 has been laser illuminated by spot 46 passing at velocity v in the x direction. Area 44 will have had mobile contacts blistered away from substrate 10 to interconnection with chip 12. In another application of this invention all the mobile contacts and their associated traces on substrate 10 are blistered away by the scanning laser beam, in what amounts to wholesale grafting of interconnects with simultaneous making of their contacts. This would enable the manufacture of individual ICs or interconnected quilts of chips in a different way, viz. by fabricating entire interconnect layers off chip and only later attaching them.

It must be emphasized that although this invention is optimally implemented with two theoretically flat and parallel facing arrays of contact pads separated by a small known gap 21, the gap need not be exactly controlled. In fact, a minimum gap size is only important when some contacts are to remain or expansion mismatch is great. Inherent in the invention concept is an appreciable latitude in materials and process conditions. The very nature of the blisterable layer 15 will insure self correcting of expected variations in inter-contact distances due to non-flatness and non-parallelism. The stationary contact 18 waiting at a gap distance 21 for the approaching mobile contact 16 provides for a positive mechanical stop for the mobile contact. Moderate overpowering during blistering will primarily cause the blister to rupture but should not greatly effect the bond quality. In fact, as set forth above, this rupturing may be highly desirable to stress-relieve the formed contact bond. The fixed limit to mobile contact travel provides a wide window of acceptable process conditions to achieve successful bonding.

In FIG. 22 the gap between contact pads on chips 12 and substrate 10 is effectively made to be zero. The contacts are kept insulated from each other by an additional temporarily insulating film 48 disposed on either one or both of the contact pads. Thus, programmability is retained. Upon laser, or other form of heating, film 48 experiences both heating and compression, due to the lifting and heating of mobile contact 16. Several mechanisms are possible to render the path between the contact pads 16 and 18 conductive. For example, film 48 could consist of very heavily implanted polysilicon or amorphous silicon which can be rendered conductive by depositing bursts of laser energy therein, either directly or indirectly. It could be a material which will dewet upon heating and pull out of the 16/18 interface by capillary action, it could be a material which will go into solution in the microweld itself to yield the desired result, or it could be a material which can substantially vaporize to permit 16/18 interface intimacy. This arrangement requires no gap setting. Most blister bond applications, however, would incorporate a set gap since it provides both electrical isolation of contacts not to be bonded and it minimizes interfacial shear strain in direct proportion to its size.

Having described various embodiments of this unique interconnection invention, it should be apparent that its advantages are numerous. First of all, the minute size and density of achievable interconnects is far closer to that inherent in the IC chip construction itself. Secondly, the blister bonding may be achieved using a very wide array of materials, configurations and energy input devices, resulting in interconnections that are very gently made, easily controlled, shock and fatigue resistant and of exceedlingly low cost. Thirdly, the invention lends itself to great flexibility in the size and shape of contacts on a single chip. Fourthly, the ability to gang bond or program specific interconnections, as desired, permits customization and redundancy to be employed more pervasively, resulting in higher yields and reduced costs. Fifthly, wafer-scale integrated systems are readily achievable by quilting together arrays of chips. Sixthly, the blistering action may be employed to reduce parasitic capacitance and to match the propagation delay of different length traces.

This unique interconnection process may find use wherever electrical interconnections are made, whether such interconnection be a few microns or a few hundred mirons in size.

It should be understood that the present disclosure has been made only by way of example and that numerous changes in details of construction and the combination and arrangement of parts may be resorted to without departing from the true spirit and the scope of the invention as hereinafter claimed.

What is claimed is:

1. A method for producing microinterconnections characterized by including the following steps,
   providing a first support member bearing electrical circuit elements including first electrical contact means and first electrical trace means,
   providing a second support member bearing electrical circuit elements including second electrical contact means and second electrical trace means,
   placing said second support member in face-to-face spaced relationship with respect to said first support member,
   aligning said second contact means with said first contact means, and
   applying energy to said first support member for moving portions of said first support member, bearing ones of said first contact means, toward and into intimacy with aligned ones of said second contact means, and for heating said ones of said first contact means to bond aligned ones of said first and second electrical contact means.

2. The method for producing microinterconnections as defined in claim 1 characterized in that said step of applying energy is effected by directing laser illumination at predetermined ones of said first contact means.

3. The method for producing microinterconnections as defined in claim 1 characterized by applying energy in a blanket manner for moving said first contact means.

4. The method for producing microinterconnections as defined in claim 3 characterized in that said step of applying energy is effected by conductive heating.

5. The method of producing microinterconnections as defined in claim 3 characterized in that said step of applying energy is effected by convective heating.

6. The method for producing microinterconnections as defined in claim 3 characterized in that said step of applying energy is effected by radiant heating.

7. The method for producing microinterconnections as defined in claim 1 characterized in that said step of applying energy moves portions of said first electrical trace means away from said first support member.

8. A support member for microinterconnections characterized by including
   substrate means,
   electrical circuit means supported upon said substrate means, said circuit means including movable electrical contact means connected to and interconnected by electrical trace means, and
   selectively deformable means positioned intermediate said substrate and said electrical circuit means, whereby portions of said electrical circuit means may be selectively moved away from said substrate means in response to the application of energy to said selectively deformable means.

9. The support member for microinterconnections as defined in claim 8 characterized in that said selectively deformable means includes a propellant layer.

10. The support member for microinterconnections as defined in claim 9 characterized in that said propellant layer is patterned.

11. The support member for microinterconnections as defined in claim 9 characterized in that said propellant layer will expand in response to the application of energy thereto.

12. The support member for microinterconnections as defined in claim 7 characterized in that said propellant layer will generate a gas in response to the application of energy thereto.

13. The support member for microinterconnections as defined in claim 8 characterized in that said selectively deformable means includes a propellant layer and an additional energy absorbing layer.

14. The support member for microinterconnections as defined in claim 8 characterized in that said selectively deformable means includes a propellant layer sandwiched between a reflector layer and a thermally insulating layer, wherein the insulating layer is adjacent said substrate.

15. The support member for microinterconnections as defined in claim 8 characterized in that said selectively deformable means includes a propellant layer and an overlying diaphragm layer.

16. The support member for microinterconnections as defined in claim 8 characterized in that said substrate means is optically transparent so that laser energy will pass therethrough into said selectively deformable means.

17. The support member for microinterconnections as defined in claim 8 characterized by including a masking layer interposed between said substrate means and said selectively deformable means, said masking layer having openings therein adjacent those portions of said electrical circuit means which are desired to be moved away from said substrate means in response to the application of energy to said deformable means in a pattern determined by said mask.

18. The support member for microinterconnections as defined in claim 8 characterized by including solder means overlying said movable electrical contact means.

19. The support member for microinterconnections as defined in claim 8 characterized in that said electrical trace means includes stress relieving means adjacent said movable electrical contact means.

20. The support member for microinterconnections as defined in claim 8 characterized by including spacer means supported upon said substrate means, said spacer means being provided for locating a mating microinterconnection member.

* * * * *